US009750127B2

(12) United States Patent
Kim et al.

(10) Patent No.: US 9,750,127 B2
(45) Date of Patent: Aug. 29, 2017

(54) CIRCUIT CARD ASSEMBLY INCLUDING HEAT TRANSFER ASSEMBLY AND METHOD OF MANUFACTURING SUCH

(71) Applicant: General Electric Company, Schenectady, NY (US)

(72) Inventors: Joo Han Kim, Nishkayuna, NY (US); Michelle Ann Parziale, Madison, AL (US); Jerry Leon Wright, Flintville, TN (US); Hendrik Pieter Jacobus de Bock, Clifton Park, NY (US); Brian Patrick Hoden, Huntsville, AL (US)

(73) Assignee: General Electric Company, Niskayuna, NY (US)

( * ) Notice: Subject to any disclaimer, the term of this patent is extended or adjusted under 35 U.S.C. 154(b) by 33 days.

(21) Appl. No.: 14/959,553

(22) Filed: Dec. 4, 2015

(65) Prior Publication Data

US 2017/0164459 A1 Jun. 8, 2017

(51) Int. Cl.
*H05K 1/02* (2006.01)
*H05K 13/04* (2006.01)
*H05K 7/20* (2006.01)

(52) U.S. Cl.
CPC ....... *H05K 1/0203* (2013.01); *H05K 7/20336* (2013.01); *H05K 13/04* (2013.01)

(58) Field of Classification Search
CPC .. H05K 1/0203; H05K 13/04; H05K 7/20336; H01L 23/427
USPC .................................................. 361/699–723
See application file for complete search history.

(56) References Cited

U.S. PATENT DOCUMENTS

| 5,353,192 | A | 10/1994 | Nordin |
| 6,397,941 | B1 | 6/2002 | McCullough |
| 6,839,235 | B2 * | 1/2005 | St. Louis ........... H05K 7/20672 165/104.33 |
| 8,205,337 | B2 | 6/2012 | Lower et al. |
| 8,616,266 | B2 | 12/2013 | Wilcoxon et al. |
| 2007/0074857 | A1 * | 4/2007 | Xia ...................... H01L 23/427 165/104.33 |
| 2008/0198554 | A1 | 8/2008 | Holmberg et al. |
| 2008/0218980 | A1 | 9/2008 | Tracewell et al. |
| 2008/0232074 | A1 | 9/2008 | Schutz et al. |
| 2008/0310122 | A1 * | 12/2008 | Chou .................... H01L 23/427 361/720 |

(Continued)

FOREIGN PATENT DOCUMENTS

WO 2014178817 A1 11/2014

*Primary Examiner* — Anthony Haughton
*Assistant Examiner* — Yahya Ahmad
(74) *Attorney, Agent, or Firm* — Nitin N. Joshi

(57) ABSTRACT

A circuit card assembly includes a first printed circuit board and a first electronic component mounted on the first printed circuit board. A heat transfer assembly is coupled to the first printed circuit board. The heat transfer assembly includes a first plate extending adjacent the first printed circuit board and a second plate extending adjacent the first plate. At least one of the first plate and the second plate includes an accommodation feature to accommodate the first electronic component. The heat transfer assembly further includes a first set of heat pipes between the first plate and the second plate. The first set of heat pipes is configured to remove heat from the first electronic component. At least one heat pipe of the first set of heat pipes extends adjacent the accommodation feature.

22 Claims, 8 Drawing Sheets

(56) References Cited

U.S. PATENT DOCUMENTS

| | | | |
|---|---|---|---|
| 2009/0159252 A1* | 6/2009 | Lai | F28D 15/0275 |
| | | | 165/171 |
| 2009/0321054 A1* | 12/2009 | Qin | H01L 23/427 |
| | | | 165/104.26 |
| 2010/0206522 A1* | 8/2010 | Zhou | H01L 23/367 |
| | | | 165/104.26 |
| 2012/0279686 A1* | 11/2012 | Chainer | H05K 7/20772 |
| | | | 165/104.21 |
| 2014/0071614 A1* | 3/2014 | Kaldani | H05K 7/20 |
| | | | 361/679.46 |
| 2014/0078673 A1* | 3/2014 | Vincent | H05K 7/20336 |
| | | | 361/700 |
| 2014/0160679 A1* | 6/2014 | Kelty | H05K 7/20672 |
| | | | 361/700 |
| 2015/0116940 A1 | 4/2015 | Kim et al. | |
| 2015/0181763 A1* | 6/2015 | de Bock | B23P 15/26 |
| | | | 361/689 |
| 2015/0354901 A1* | 12/2015 | Moore | H01L 23/427 |
| | | | 165/104.21 |

\* cited by examiner

CIRCUIT CARD ASSEMBLY INCLUDING HEAT TRANSFER ASSEMBLY AND METHOD OF MANUFACTURING SUCH

BACKGROUND

The field of the disclosure relates generally to circuit card assemblies and, more particularly, to circuit card assemblies including heat transfer assemblies.

Most modern electronics systems include at least one circuit card assembly. At least some known circuit card assemblies include a printed circuit board on which at least one electronic component, such as a processor, is mounted. Because electronic components generate heat during operation of electronics systems, circuit card assemblies typically include heat dissipation mechanisms to actively cool the electronic components to ensure the circuit card assemblies function properly. For example, at least some known circuit card assemblies include heat transfer assemblies to remove heat from the electronic components mounted on the printed circuit board. However, the electronic components are mounted on the printed circuit board in complex configurations based on the functionality of the circuit card assembly. As a result, the efficiency of the heat transfer assemblies is reduced. Moreover, in at least some known circuit card assemblies, the size of the circuit card assemblies are increased to accommodate the heat transfer assemblies. In addition, the heat transfer assemblies add weight to the circuit card assemblies and increase the manufacturing cost of the circuit card assemblies.

BRIEF DESCRIPTION

In one aspect, a circuit card assembly is provided. The circuit card assembly includes a first printed circuit board and a first electronic component mounted on the first printed circuit board. A heat transfer assembly is coupled to the first printed circuit board. The heat transfer assembly includes a first plate extending adjacent the first printed circuit board and a second plate extending adjacent the first plate. At least one of the first plate and the second plate includes an accommodation feature to accommodate the first electronic component. The heat transfer assembly further includes a first set of heat pipes between the first plate and the second plate. The first set of heat pipes is configured to remove heat from the first electronic component. At least one heat pipe of the first set of heat pipes extends adjacent the accommodation feature.

In another aspect, an electronics system includes a chassis and a circuit card assembly coupled to the chassis. The circuit card assembly includes a printed circuit board and an electronic component mounted on the printed circuit board. A heat transfer assembly is coupled to the printed circuit board. The heat transfer assembly includes a first plate extending adjacent the printed circuit board and a second plate extending adjacent the first plate. At least one of the first plate and the second plate include an accommodation feature to accommodate the electronic component. The heat transfer assembly further includes a first set of heat pipes between the first plate and the second plate. The first set of heat pipes is configured to remove heat from the first electronic component. At least one heat pipe of the set of heat pipes extends adjacent the accommodation feature.

In yet another aspect, a method of manufacturing a circuit card assembly is provided. The method includes coupling a heat transfer assembly to a first printed circuit board including at least one electronic component mounted thereon. The heat transfer assembly includes a first plate adjacent at least a portion of the first printed circuit board and a second plate adjacent at least a portion of the first plate. The method further includes forming an accommodation feature in at least one of the first plate and the second plate and coupling a set of heat pipes to the heat transfer assembly such that the set of heat pipes removes heat from the at least one electronic component. At least one heat pipe of the set of heat pipes extends adjacent the accommodation feature.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems including one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The circuit card assemblies described herein include a heat transfer assembly to facilitate cooling the circuit card assemblies. In particular, the heat transfer assembly includes a plurality of plates to facilitate heat removal from electronic components mounted in complex configurations on a printed circuit board of the circuit card assembly. In some embodiments, heat pipes are coupled to at least one of the plurality of plates and extend adjacent accommodation features of the plurality of plates to facilitate cooling the electronic components of the circuit card assembly. In some embodiments, the heat pipes are asymmetric such that the heat pipes provide redundant cooling of the circuit card assemblies.

Figure 1:
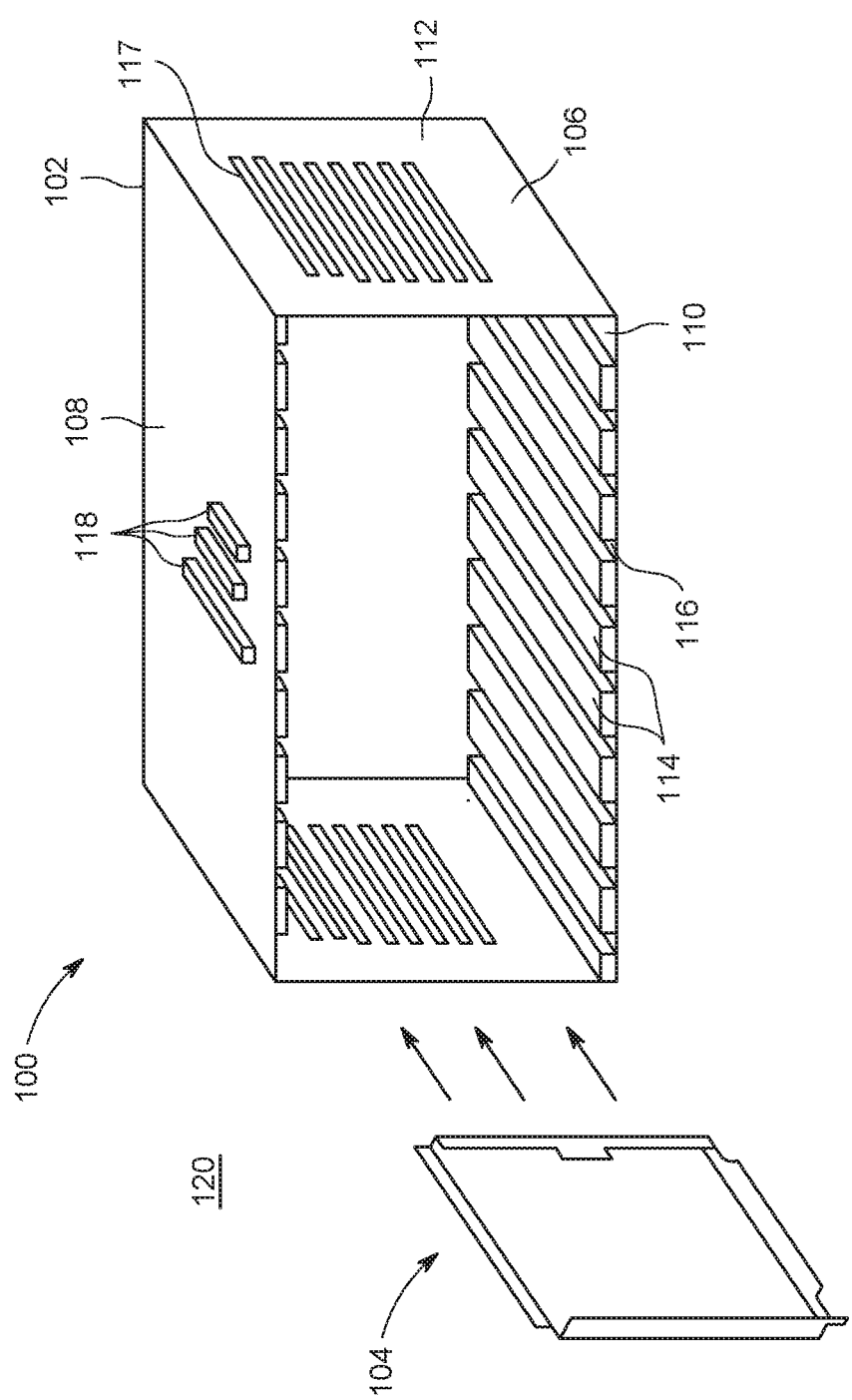
FIG. 1 is a perspective view of an exemplary electronic system.

FIG. 1 is a perspective view of an exemplary electronics system 100. In the exemplary embodiment, electronics system 100 includes a chassis 102 and a circuit card assembly (CCA) 104. Chassis 102 includes a housing 106 having a top wall 108, a bottom wall 110, and a pair of side walls 112. Each of top wall 108 and bottom wall 110 includes a plurality of spaced-apart rails 114 such that a slot 116 is defined between adjacent rails 114. Each slot 116 defined along top wall 108 is substantially aligned with a corresponding slot 116 defined along bottom wall 110 such that CCA 104 is slidably receivable therein. Housing 106 also includes a vent 117 that facilitates channeling air through housing 106, and a plurality of external fins 118 that facilitate convective heat transfer from housing 106 to an ambient environment 120. In some embodiments, housing 106 includes a front wall (not shown) and a back wall (not shown) such that CCA 104 is completely enclosed within housing 106. In alternative embodiments, chassis 102 includes any housing that enables electronics system 100 to operate as described herein. For example, in some embodiments top wall 108 and bottom wall 110 include vents 117 and a fan (not shown) is positioned adjacent housing 106 to facilitate channeling air through housing 104 and facilitate convection cooling of CCA 200 (shown in FIG. 6). In further embodiments, vent 117 is omitted.

Figure 2:
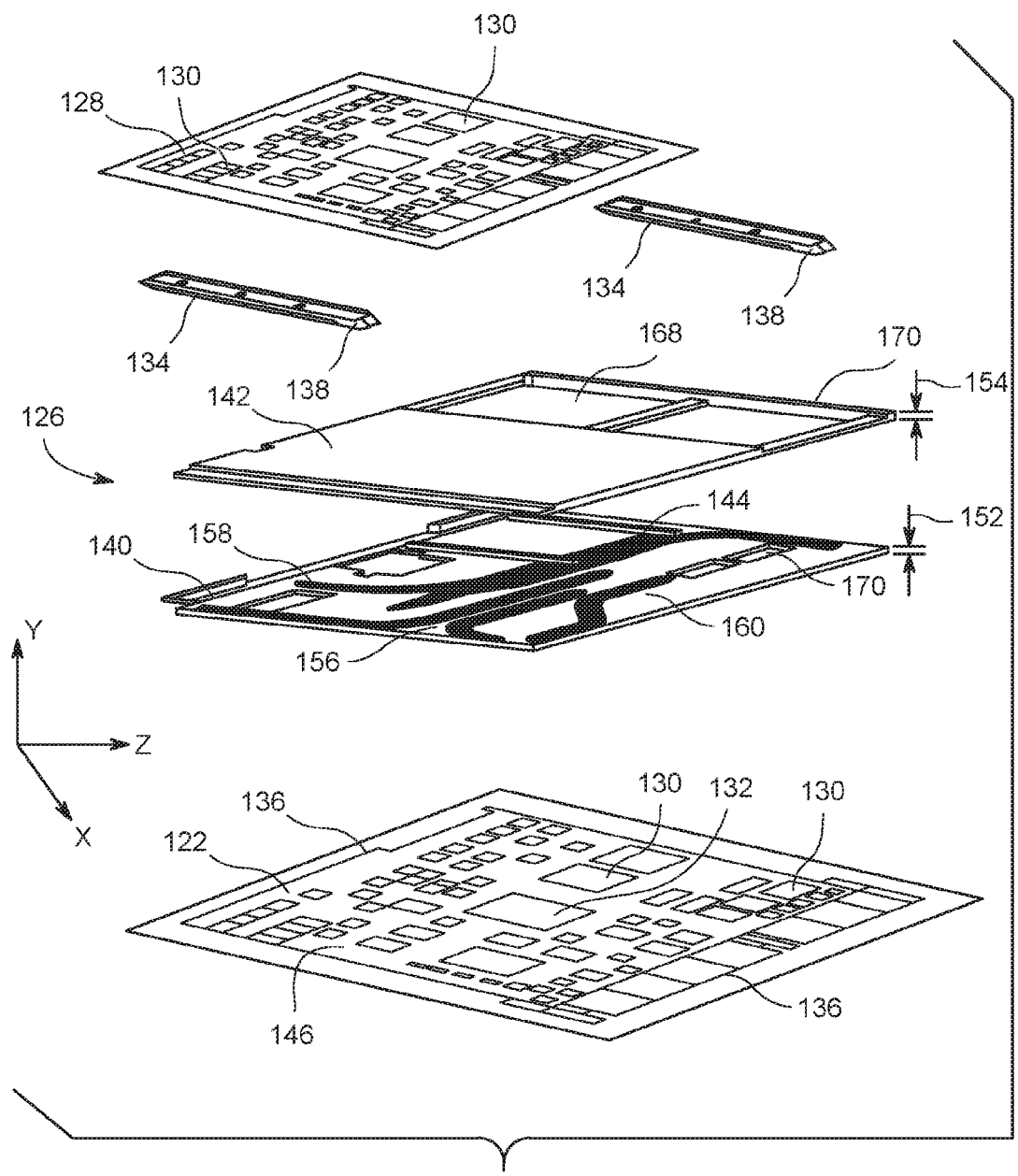
FIG. 2 is an exploded perspective view of a circuit card assembly of the electronic system shown in FIG. 1.
Figure 3:
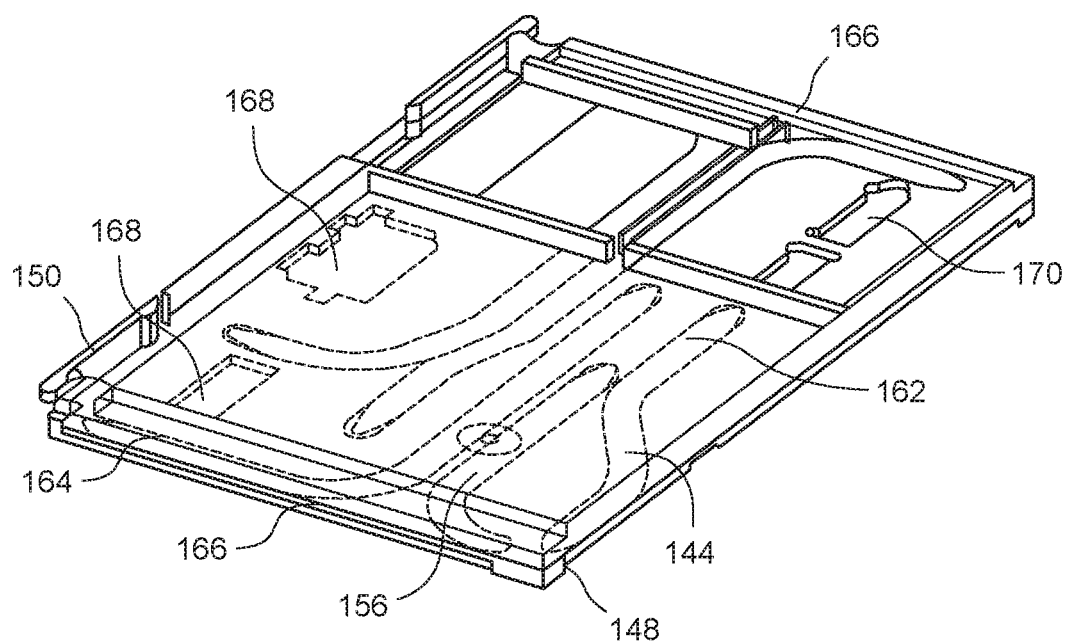
FIG. 3 is a perspective view of a portion of the circuit card assembly shown in FIG. 2.

FIG. 2 is an exploded view of CCA 104, and FIG. 3 is a perspective view of a portion of CCA 104. FIG. 2 includes an X-axis, a Y-axis, and a Z-axis for reference during the following description. In the exemplary embodiment, CCA 104 includes a first printed circuit board (PCB) 122, a heat transfer assembly 126 coupled to first PCB 122, and a second PCB 128 coupled to heat transfer assembly 126. In alternative embodiments, CCA 104 includes any components that enable electronics system 100 to operate as described herein. For example, in some embodiments CCA 104 includes three or more PCB's. In further embodiments, at least one of first PCB 122 and second PCB 128 is omitted. In the exemplary embodiment, a plurality of electronic components 130 are mounted on first PCB 122 and second PCB 128. At least one of electronic components 130 is a processor 132. In alternative embodiments, any electronic components 130 are mounted on first PCB 122 and second PCB 128 that enable CCA 104 to operate as described herein. For example, in some embodiments, the number, placement, and/or type of electronic components 130 mounted on first PCB 122 is based on the desired functionality of CCA 104. In further embodiments, at least one of first PCB 122 and second PCB 128 complies with standards of the American National Standards Institute (ANSI), the VITA Standards Organization (VSO), and/or the Institute for Electrical and Electronics Engineers (IEEE).

In the exemplary embodiment, a pair of side rails 134 that extend along side edges 136 of first PCB 122. In alternative embodiments, CCA 104 104 has any side rail 134 that enables CCA 104 to operate as described herein. For example, in some embodiments, side rails 134 are omitted to facilitate convection cooling. As described above, CCA 104 is slidably receivable in slots 116 of housing 106. In the exemplary embodiment, side rails 134 and heat transfer assembly 126 have a combined thickness such that CCA 104 is coupled to housing 106 within slots 116 with an interference fit. CCA 104 is coupled to housing 106 such that heat generated by electronics components 130 is transferred from heat transfer assembly 126 towards housing 106 and dissipated to ambient environment 120 (shown in FIG. 1). In the exemplary embodiment, CCA 104 also includes a wedge lock mechanism 138. Wedge lock mechanism 138 ensures CCA 104 remains securely positioned in corresponding slots 116 (shown in FIG. 1) when CCA 104 is inserted within chassis 102 (shown in FIG. 1). In alternative embodiments, CCA 104 is secured in housing 106 in any manner that enables electronics system 100 to operate as described herein. For example, in some embodiments, CCA 104 includes an ejector handle to facilitate securing CCA 104 to housing 106.

Heat transfer assembly 126 includes a first plate 140, a second plate 142, and a plurality of heat pipes 144. In alternative embodiments, heat transfer assembly 126 includes any plates and/or heat pipes that enable CCA 104 to operate as described herein. In the exemplary embodiment, first plate 140 extends over at least a portion of first PCB 122. First plate 140 is configured such that heat is transferred from electronic components 130 through heat transfer assembly 126 for dissipation to environment 120. Second plate 142 extends over first plate 140 and at least some electronic components 130 mounted on first PCB 122. In some embodiments, shapes of first plate 140 and/or second plate 142 are selected as a function of a distance that electronic components 130 extend from a first surface 146 of first PCB 122 in a direction parallel to the Y-axis. In addition, second PCB 128 is coupled to second plate 142 when CCA 104 is assembled. As such, first PCB 122 is positioned on a first side 148 of heat transfer assembly 126 and second PCB 128 is positioned on a second side 150 of heat transfer assembly 126 opposite first side 148. In one embodiment, first side 148 is generally hotter than second side 150 as a result of adjacent heat generating electronic components 130 mounted on first PCB 122. Accordingly, heat transfer assembly 126 including heat pipes 144 is positioned between first PCB 122 and second PCB 128, i.e., sandwiched, which facilitates heat transfer assembly 126 removing heat from first PCB 122 and second PCB 128.

In some embodiments, first plate 140 has a thickness 152 in a range between about 2 millimeters (mm) (0.079 inches (in.)) and about 7.5 mm (0.295 in.). In further embodiments, first plate 140 has a thickness 152 in a range between about 5 millimeters (mm) (0.197 inches (in.)) and about 9 mm (0.354 in.). In the exemplary embodiment, first plate 140 has a thickness 152 of approximately 3 mm (0.118 in.). In some embodiments, second plate 142 has a thickness 154 in a range between about 9 mm (0.354 in.) and about 18 mm (0.708 in.). In alternative embodiments, first plate 140 and second plate 142 have any respective thickness 152, 154 that enable CCA 104 to operate as described herein. Thickness 152 and thickness 154 facilitate CCA 104 fitting in slots 116 of housing 106. Moreover, in some embodiments, thickness 152 and thickness 154 reduce the material required to manufacture CCA 104 and, therefore, reduce cost and time required to manufacture CCA 104.

In the exemplary embodiment, heat pipes 144 are coupled to first plate 140 and configured to withdraw heat from electronic components 130 mounted on first PCB 122. In addition, heat pipes 144 withdraw heat from electronic components 130 mounted on second PCB 128. In some embodiments, second plate 142 facilitates transferring heat from electronic components 130 mounted on second PCB 128 towards heat pipes 144. Heat pipes 144 include sidewalls 156 defining passageways for heat transfer fluid to flow through heat pipes 144. In alternative embodiments, heat pipes 144 have any configuration that enables CCA 104 to operate as described herein. In some embodiments, a thermally conductive member (not shown) is coupled to heat pipes 144 and electronic components 130 to facilitate heat transfer between electronic components 130 and heat pipes 144. The thermally conductive member is fabricated from any material that enables heat transfer assembly 126 to function as described herein. For example, in one embodiment, a rigid thermally conductive material such as aluminum, copper, or magnesium is coupled to electronic components 130 and heat pipes 144. In further embodiments, a flexible material such as a gap pad, or a flexible mechanism including nanosprings such as a thermal bridge is coupled to electronic components 130 and heat pipes 144.

First plate 140 and second plate 142 are fabricated from any material that enables heat transfer assembly 126 to function as described herein. For example, in one embodiment, first plate 140 is fabricated from a thermally conductive material such as aluminum, copper, or magnesium. In such embodiments, some heat generated by processor 132 is conducted directly through first plate 140. In alternative embodiments, first plate 140 is fabricated from a substantially non-thermally conductive material such as carbon fiber reinforced polymer, and heat pipes 144 facilitate transferring a majority of heat from processor 132 when compared to the heat transferred by first plate 140. As such, the heat transfer capability of heat transfer assembly 126 is substantially maintained and the weight of CCA 104 having first plate 140 fabricated from non-thermally conductive material is reduced when compared to a CCA 104 having first plate 140 fabricated from thermally conductive material.

As described above and shown in FIGS. 2 and 3, heat pipes 144 are coupled to first plate 140. In particular, heat pipes 144 are partially embedded within first plate 140 such that an exposed surface 158 of each heat pipe 144 is substantially coplanar with a first surface 160 of first plate 140. In the exemplary embodiment, heat pipes 144 have a substantially rectangular cross-sectional shape such that a width of each heat pipe 144 measured along the Z-axis is greater than its thickness measured along the Y-axis. In alternative embodiments, heat pipes 144 have any cross-sectional shape that enables heat transfer assembly 126 to function as described herein. In the exemplary embodiment, heat pipes 144 extend through predetermined locations of first plate 140 based on locations of electronic components 130, such as processor 132 mounted on first PCB 122. For example, heat generated by electronic components 130 will generally be transferred to portions of heat pipes 144 adjacent electronic components 130. In some embodiments, at least one of heat pipes 144 is routed adjacent multiple electronic components 130. In further embodiments, at least one of heat pipes 144 is routed at least partially beyond wedge lock mechanism 138.

Also, heat pipes 144 include evaporator portions 162 extending along first plate 140, and condenser portions 164 extending from first plate 140 towards side edges 166 of heat transfer assembly 126. Specifically, evaporator portions 162 are positioned adjacent to processor 132, and condenser portions 164 extend along side edges 166 in a variety of different orientations. Extending condenser portions 164 along side edges 166 facilitates increasing heat dissipation by positioning condenser portions 164 away from the sources of heat. Moreover, extending condenser portions 164 in a variety of orientations ensures heat transfer assembly 126 continues to function properly when external forces, such as G-forces, are exerted on CCA 104. For example, in some embodiments, chassis 102 is implemented in aircraft such as airplanes, unmanned aerial vehicles (UAVs), gliders, helicopters, and/or any other object that travels through airspace. G-forces exerted on CCA 104 during flight sometimes impede movement of working fluid flowing through heat pipes 144, thereby reducing the heat transfer capability of an individual heat pipe 144. Extending heat pipes 144 in a variety of orientations facilitates offsetting reduced heat transfer capability in heat transfer assembly 126 caused by counteractive G-forces. For example, reduced heat transfer capability of a heat pipe 144 extending in a first direction is offset when the G-forces simultaneously aid movement of working fluid in a heat pipe 144 extending in an opposing second direction. In addition, the span that each heat pipe 144 extends is limited to inhibit drying of heat transfer fluid and increase redundancy. For example, some heat pipes 144 extend over electronic component 130 and terminate adjacent electronic component 130 on end and extend towards side edges 166 on the other end.

In the exemplary embodiment, first plate 140 and second plate 142 include accommodation features 168 substantially aligned with electronic components 130 mounted on first PCB 122 and second PCB 128. First plate 140 and second plate 142 are modifiable to accommodate variations in configurations of electronic components 130 mounted on first PCB 122, shapes of components, and/or distances that electronic components 130 extend from first surface 146. For example, first plate 140 and second plate 142 include a plurality of cutouts 170 to accommodate electronic components 130. The shapes of cutouts 170 are selected to substantially conform with electronic components 130 such that electronic components 130 are at least partially received within cutouts 170 when heat transfer assembly 126 is coupled to first PCB 122. As such, forming cutouts 170 in first plate 140 and second plate 142 enables CCA 104 to remain substantially compact, and facilitates sizing CCA 104 for insertion within slots 116 (shown in FIG. 1.). In addition, in some embodiments, first plate 140 and second plate 142 include a plurality of standoffs to accommodate electronic components 130. In alternative embodiments, heat transfer assembly 126 includes any accommodation features 168 that enable CCA 104 to operate as described herein.

Moreover, in the exemplary embodiment, heat pipes 144 extend through portions of first plate 140 adjacent accommodation features 168. For example, heat pipes 144 extend through portions of first plate 140 adjacent cutouts 170 in second plate 142. Accordingly, first plate 140 and second plate 142 facilitate heat transfer assembly 126 removing heat from electronic components 130 mounted on first PCB 122 and second PCB 128 in complex geometries. In alternative embodiments, heat transfer assembly 126 includes any plates that enable CCA 104 to operate as described herein. In further embodiments, heat pipes 144 are coupled to any plates of heat transfer assembly 126 that enable CCA 104 to operate as described herein.

Figure 4:
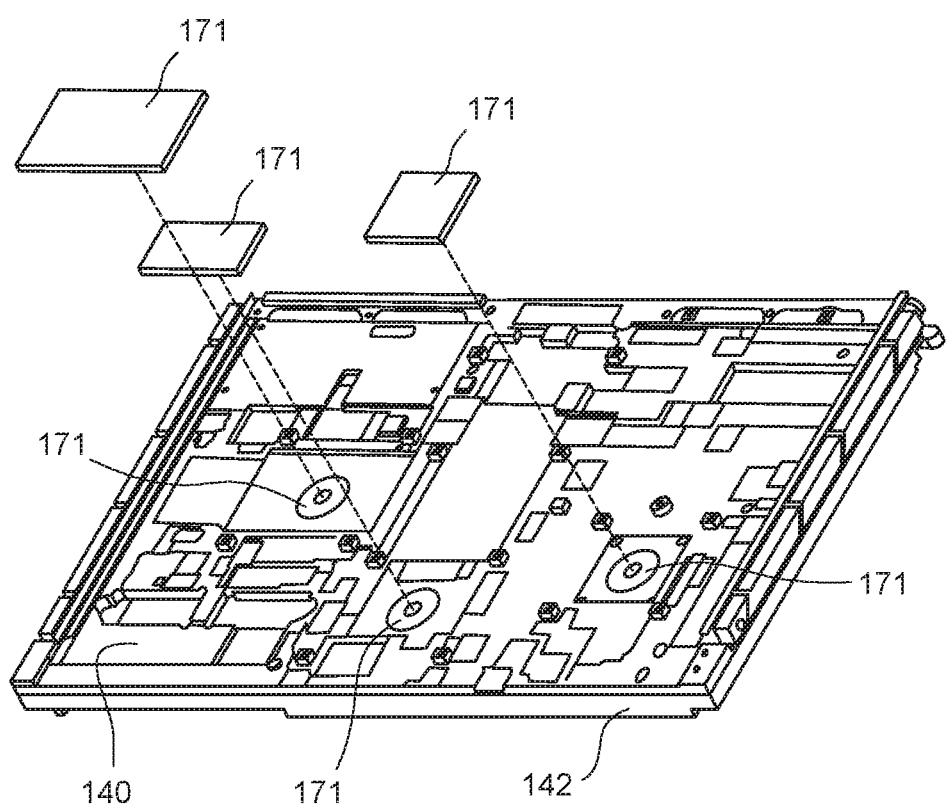
FIG. 4 is a perspective view of a portion of the circuit card assembly shown in FIG. 2

FIG. 4 is a perspective view of a portion of CCA 104. In particular, FIG. 4 shows an underside of first plate 140. A plurality of contact members 171 are positioned between electronic components 130 (shown in FIG. 2) and first plate 140. In addition, contact members 171 are positioned between first plate 140 and second plate 142 and between second plate 142 and second PCB 128. Contact members 171 facilitate transfer of heat between electronic components 130 and first plate 140. For example, in some embodiments, contact members 171 include any of the following, without limitation, thermal gel, thermal, grease, and gap pads. In alternative embodiments, CCA 104 includes any contact members 171 that enable CCA 104 to operate as described herein.

Figure 5:
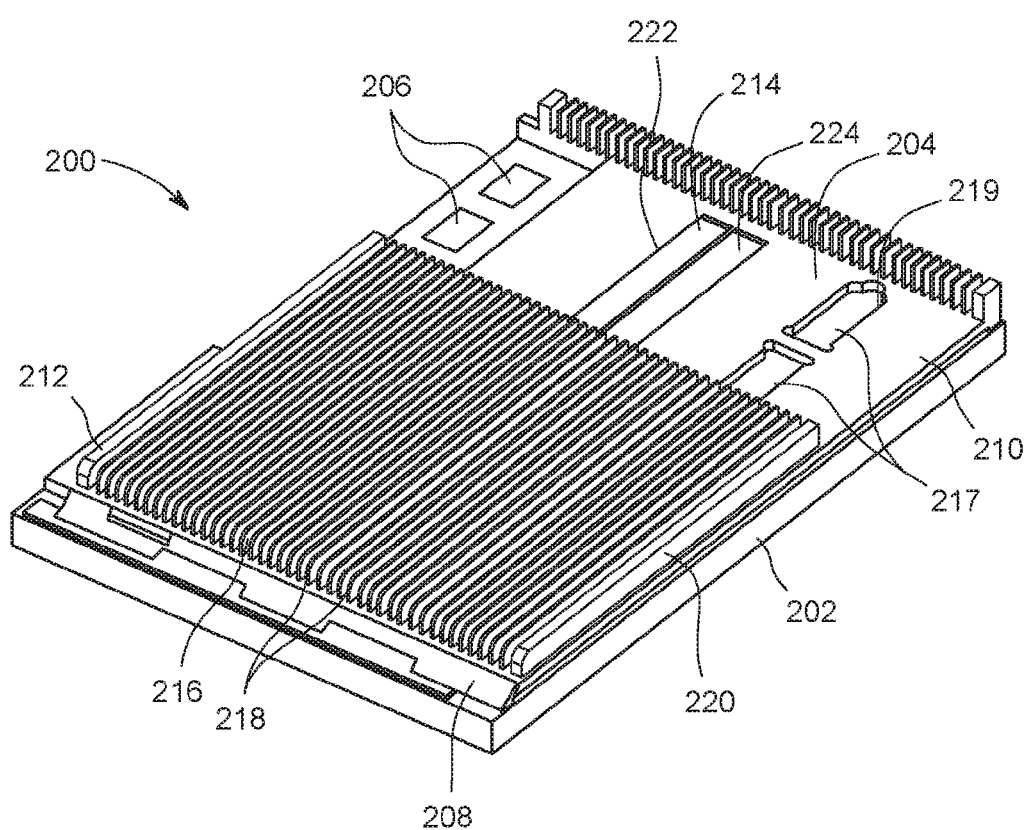
FIG. 5 is a perspective view of an exemplary circuit card assembly including a heat transfer assembly.

FIG. 5 is a perspective view of a circuit card assembly (CCA) 200. FIG. 5 includes an X-axis, a Y-axis, and a Z-axis for reference during the following description. In the exemplary embodiment, CCA 200 includes a printed circuit board (PCB) 202 and a heat transfer assembly 204 coupled to PCB 202. A plurality of electronic components 206 are mounted on PCB 202. In reference to the orientation shown in FIG. 5, heat transfer assembly 204 includes an upper plate 208, a lower plate 210, upper heat pipes 212, lower heat pipes 214, and a heat sink 216. Lower plate 210 is coupled to PCB 202 such that lower plate 210 extends at least partially over electronic components 206 mounted on PCB 202. In the exemplary embodiment, lower plate 210 includes a plurality of cutouts 219 to accommodate electronic components 206. Upper plate 208 is coupled to lower plate 210 such that upper plate 208 extends at least partially over electronic components 206 and cutouts 219. In alternative embodiments, upper plate 208, lower plate 210, and PCB 202 are coupled in any manner that enables CCA 200 to operate as described herein. Moreover, in alternative embodiments, heat transfer assembly 204 includes any plates and/or heat sinks that enable CCA 200 to operate as described herein.

In the exemplary embodiment, heat sink 216 includes a plurality of fins 218 coupled to upper plate 208 to facilitate convection cooling of CCA 200. Fins 218 extend longitudinally along CCA 200 in a direction parallel to the Z-axis and vertically from upper plate 208 in a direction parallel to the Y-axis. In operation, heat is transferred from electronic components 206 through upper heat pipes 212 and lower heat pipes to heat sink 216 and dissipated to environment 120 (shown in FIG. 1) via fins 218. In alternative embodiments, heat sink 216 has any configuration that enables CCA 200 to operate as described herein.

Figure 6:
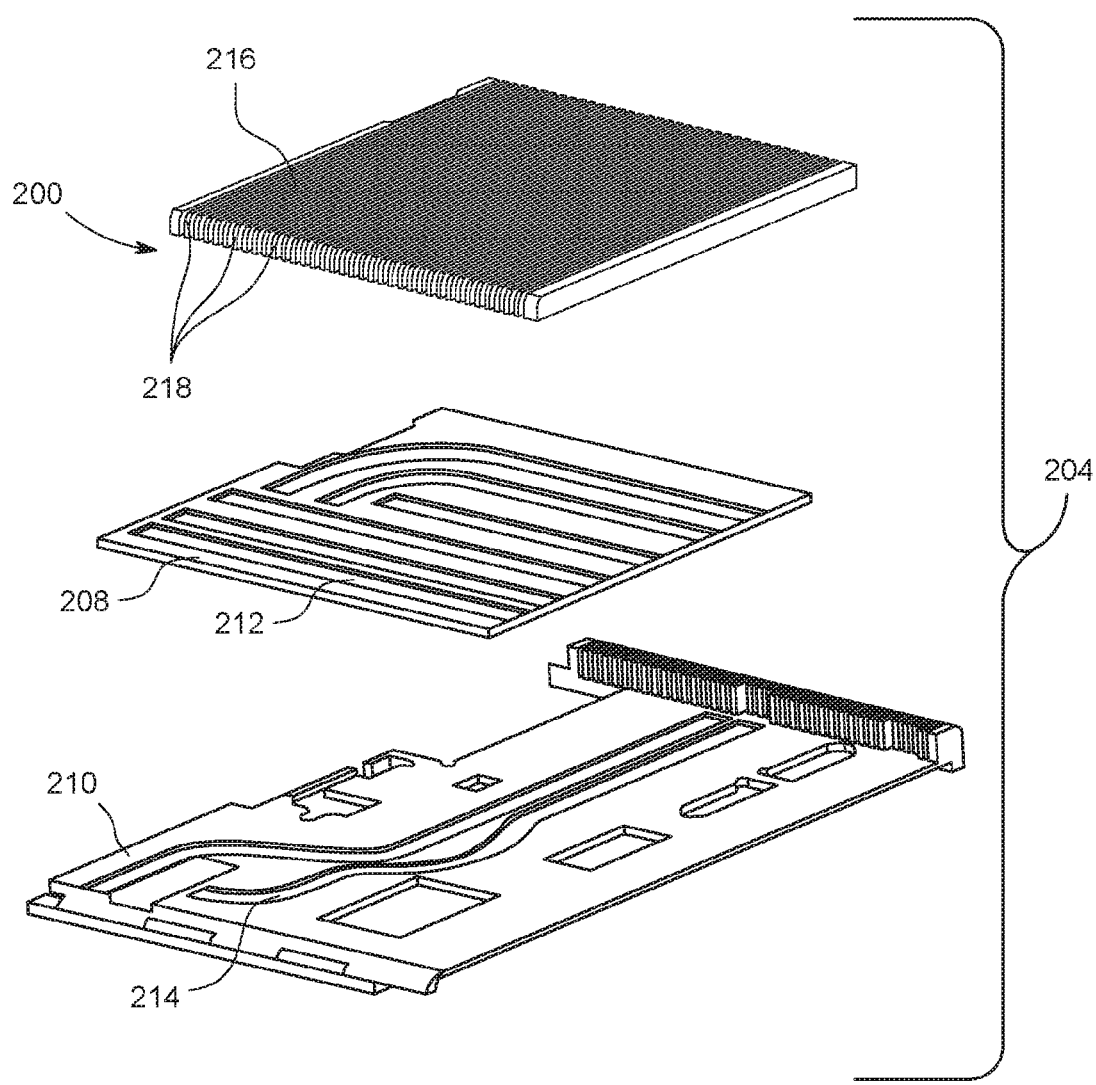
FIG. 6 is an exploded perspective view of the heat transfer assembly shown in FIG. 5.
Figure 7:
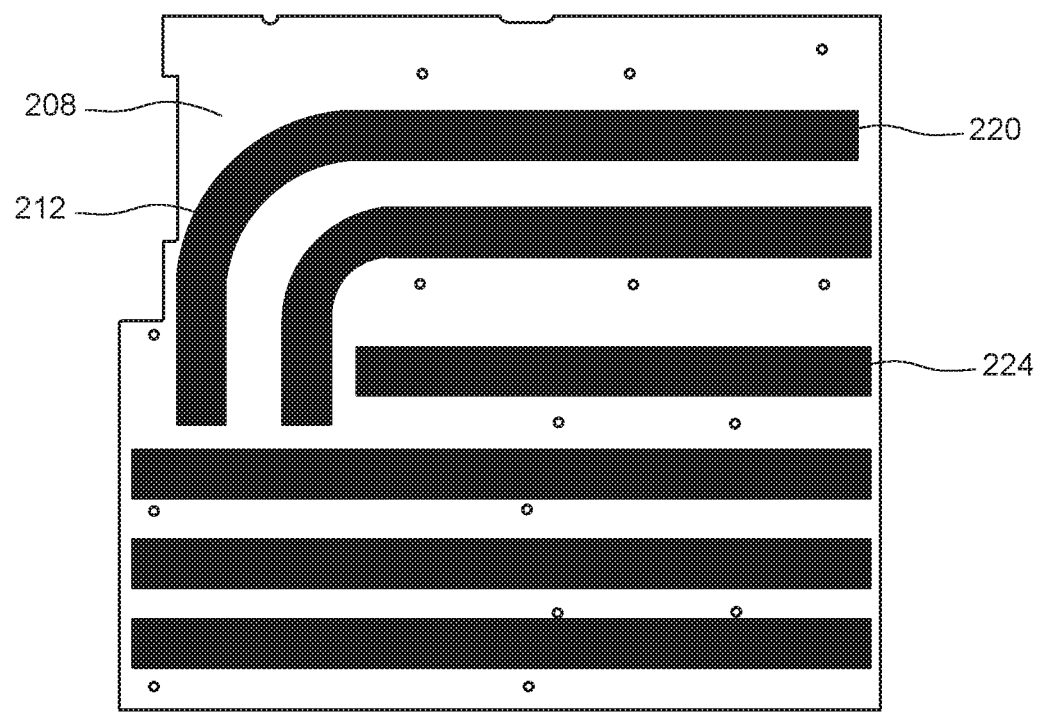
FIG. 7 is a top plan view of an upper plate of the heat transfer assembly shown in FIG. 5.
Figure 8:
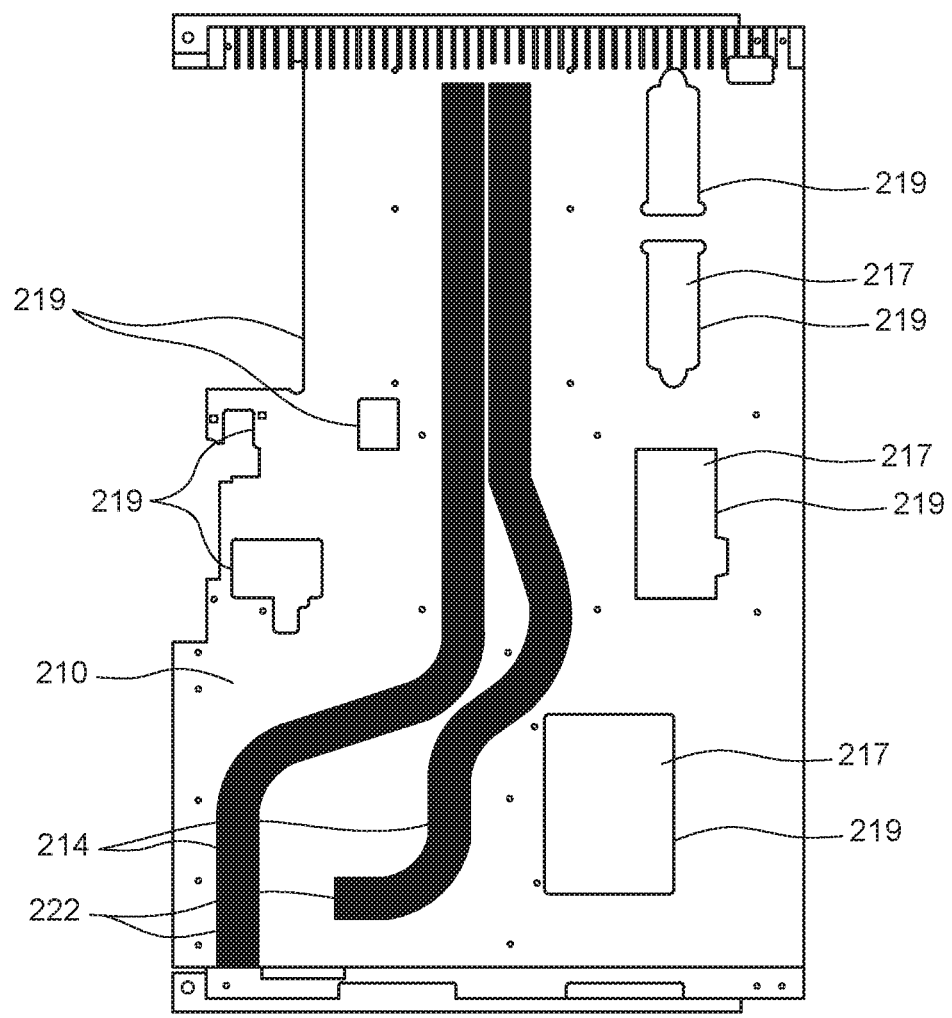
FIG. 8 is a top plan view of a lower plate of the heat transfer assembly shown in FIG. 5.

FIG. 6 is an exploded perspective view of heat transfer assembly 204. FIG. 7 is a top plan view of an upper plate 208 of heat transfer assembly 204. FIG. 8 is a top plan view of a lower plate 210 of heat transfer assembly 204. Upper plate 208 and lower plate 210 include accommodation features 217 substantially aligned with electronic components 206 mounted on PCB 202. In particular, each of upper plate 208 and lower plate 210 include cutouts 219 to accommodate electronic components 206. In alternative embodiments, upper plate 208 and lower plate 210 include any accommodation features 217 that enable CCA 200 to function as described herein.

In the exemplary embodiment, upper plate 208 defines a plurality of upper grooves 220 and lower plate 210 defines a plurality of lower grooves 222. Upper heat pipes 212 are embedded in upper grooves 220 of upper plate 208 and lower heat pipes 214 are embedded in lower grooves 222 of lower plate 210. Upper heat pipes 212 and lower heat pipes 214 are configured to remove heat from electronic components 206 when heat transfer assembly 204 is coupled to PCB 202. Upper heat pipes 212 and lower heat pipes 214 include sidewalls 224 defining passageways for heat transfer fluid to flow through to facilitate transferring heat from electronic components 206 to environment 120 (shown in FIG. 1). In alternative embodiments, heat transfer assembly 204 includes any heat pipes that enable CCA 200 to operate as described herein.

In the exemplary embodiment, lower heat pipes 214 and upper heat pipes 212 are in thermal contact such that heat from electronic components 206 is transferred through heat transfer fluid in lower heat pipes 214 to heat transfer fluid in upper heat pipes 212. Further, upper heat pipes 212 transfer at least a portion of the heat to fins 218 of heat sink 216 to facilitate convection cooling of CCA 200. As a result, heat transfer assembly 204 does not require a heat exchanger and relies on convection cooling to remove heat from CCA 200. As such, heat transfer assembly 204 reduces the manufacturing cost and increases the reliability of CCA 200. In alternative embodiments, heat transfer assembly 204 removes heat from CCA 200 using any heat transfer process that enables CCA 200 to function as described herein.

In the exemplary embodiment, some of lower heat pipes 214 extend at least partially longitudinally along CCA 200 in a direction parallel to the Z-axis and some of upper heat pipes 212 extend at least partially transversely along CCA 200 in a direction parallel to the X-axis such that at least a portion of lower heat pipes 214 and upper heat pipes 212 are substantially perpendicular. By extending in multiple directions, upper heat pipes 212 and lower heat pipes 214 provide redundancy for heat transfer assembly 204 to increase the operating efficiency of CCA 200 during various environmental conditions. In alternative embodiments, upper heat pipes 212 and lower heat pipes 214 extend in any directions that enable CCA 200 to function as described herein.

In reference to FIGS. 2-4, a method of manufacturing CCA 104 includes coupling a heat transfer assembly 126 to first PCB 122. In some embodiments, second PCB 128 is coupled to heat transfer assembly 126. In further embodiments, heat transfer assembly 126 includes heat sink 216 to facilitate convection cooling of CCA 104. In the exemplary embodiment, heat transfer assembly 126 includes first plate 140 extending over at least a portion of first PCB 122 and second plate 142 extending over at least a portion of first plate 140. In some embodiments, heat sink 216 is coupled to at least one of first plate 140 and second plate 142. Also, in the exemplary embodiment, at least one accommodation feature 168 is formed in at least one of first plate 140 and second plate 142. In some embodiments, accommodation feature 168 includes cutout 170. Moreover, in the exemplary embodiment, heat pipes 144 are coupled to heat transfer assembly 126 such that heat pipes 144 remove heat from electronic component 130. Heat pipes 144 extend adjacent accommodation feature 168. In some embodiments, upper heat pipes 212 are coupled to second plate 142 and lower heat pipes 214 are coupled to first plate 140. In further embodiments, upper heat pipes 212 extend in a first direction and lower heat pipes 214 pipes extend in a second direction different from the first direction.

The above described circuit card assemblies include a heat transfer assembly to facilitate cooling the circuit card assemblies. In particular, the heat transfer assembly includes a plurality of plates to facilitate heat removal from electronic components mounted in complex configurations on a printed circuit board of the circuit card assembly. In some embodiments, heat pipes are coupled to at least one of the plurality of plates and extend adjacent accommodation features of the plurality of plates to facilitate cooling the electronic components of the circuit card assembly. In some embodiments, the heat pipes are asymmetric such that the heat pipes provide redundant cooling of the circuit card assemblies.

An exemplary technical effect of the methods, systems, and apparatus described herein includes at least one of: (a) improving thermal performance of circuit card assemblies; (b) enabling circuit card assemblies to implement processors having increased power outputs; (c) reducing the size of circuit card assemblies; (d) providing heat transfer assemblies configured for use with circuit card assemblies including components arranged in complex geometries; (e) reducing weight of circuit card assemblies; (0 reducing cost and time required to manufacture circuit card assemblies; (g) increasing reliability of circuit card assemblies; and (h) providing circuit card assemblies for use in systems experiencing external forces, such as G-forces.

Exemplary embodiments of circuit card assemblies that include heat transfer assemblies are described above in detail. The circuit card assemblies including heat transfer assemblies, and methods of operating and manufacturing such systems and devices are not limited to the specific embodiments described herein, but rather, components of systems and/or steps of the methods may be utilized independently and separately from other components and/or steps described herein. For example, the methods may also be used in combination with other circuit cards, and are not limited to practice with only the circuit card assemblies, and methods as described herein. Rather, the exemplary embodiment can be implemented and utilized in connection with many other applications requiring cooling of electronic circuitry.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A circuit card assembly comprising:
   a first printed circuit board;
   a first electronic component mounted on said first printed circuit board; and
   a heat transfer assembly coupled to said first printed circuit board, said heat transfer assembly comprising:
      a first plate extending adjacent said first printed circuit board;
      a second plate extending adjacent said first plate in a direction of a thickness of the said first plate, at least one of said first plate and said second plate comprising an accommodation feature to accommodate said first electronic component; and
      a first set of heat pipes between said first plate and said second plate, said first set of heat pipes configured to remove heat from said first electronic component, at least one heat pipe of said first set of heat pipes extending adjacent said accommodation feature.

2. The circuit card assembly in accordance with claim 1, wherein at least one of said first plate and said second plate define a plurality of grooves and said first set of heat pipes is embedded at least partially in said plurality of grooves.

3. The circuit card assembly in accordance with claim 1 further comprising a second set of heat pipes, said first set of heat pipes coupled to said first plate and said second set of heat pipes coupled to said second plate.

4. The circuit card assembly in accordance with claim 3, wherein said first plate defines a first set of grooves and said second plate comprises a second set of grooves, said first set of heat pipes embedded at least partially in said first set of grooves and said second set of heat pipes embedded at least partially in said second set of grooves.

5. The circuit card assembly in accordance with claim 3, wherein said first set of heat pipes extends at least partially in a first direction and said second set of heat pipes extends at least partially in a second direction different than the first direction.

6. The circuit card assembly in accordance with claim 5, wherein said accommodation feature comprises at least one cutout defined in said first plate and wherein the shape of the cutout is selected to substantially conform with said first electronic component such that said first electronic component is at least partially received within the cutout.

7. The circuit card assembly in accordance with claim 1 further comprising a second printed circuit board coupled to said heat transfer assembly such that said second printed circuit board extends adjacent said second plate.

8. The circuit card assembly in accordance with claim 7 further comprising a second electronic component mounted on said second printed circuit board, said heat transfer assembly further comprising a second set of heat pipes configured to remove heat from said second electronic component.

9. The circuit card assembly in accordance with claim 1, wherein said heat transfer assembly further comprises a plurality of heat fins coupled to said second plate.

10. The circuit card assembly in accordance with claim 9, wherein said heat fins are thermally coupled to said second set of heat pipes.

11. The circuit card assembly in accordance with claim 1, wherein said first set of heat pipes comprises a plurality of heat pipes.

12. The circuit card assembly in accordance with claim 11, wherein each heat pipe of said first set of heat pipes comprises a sidewall defining a passageway for heat exchange fluid to flow through.

13. The circuit card assembly in accordance with claim 12 further comprising a heat exchanger configured to remove heat from said first set of heat pipes.

14. The circuit card assembly in accordance with claim 1, wherein shapes of said first plate and/or said second plate are selected as a function of a distance that said first electronic component extend from a first surface of said first printed circuit board in a direction parallel to a printed circuit board thickness.

15. The circuit card assembly in accordance with claim 1, wherein said first set of heat pipes include evaporator portions extending along said first plate, and condenser portions extending from said first plate towards side edges of said heat transfer assembly.

16. An electronics system comprising:
   a chassis; and
   a circuit card assembly coupled to said chassis, said circuit card assembly comprising:
      a printed circuit board;
      an electronic component mounted on said printed circuit board; and a heat transfer assembly coupled to said printed circuit board, said heat transfer assembly comprising:
  a first plate extending adjacent said printed circuit board;
  a second plate extending adjacent said first plate in a direction of a thickness of the said first plate, at least one of said first plate and said second plate comprising an accommodation feature to accommodate said electronic component; and
  a first set of heat pipes between said first plate and said second plate, said first set of heat pipes configured to remove heat from said electronic component, at least one heat pipe of said first set of heat pipes extending adjacent said accommodation feature.

17. The electronics system in accordance with claim 16 further comprising a second set of heat pipes, wherein said first plate defines a first set of grooves and said second plate comprises a second set of grooves, said first set of heat pipes embedded at least partially in said first set of grooves and said second set of heat pipes embedded at least partially in said second set of grooves.

18. The electronics system in accordance with claim 17, wherein at least one heat pipe of said first set of heat pipes extends at least partially in a first direction and at least one heat pipe of said second set of heat pipes extends at least partially in a second direction different than the first direction, each of said at least one heat pipe of said first set of heat pipes and said at least one heat pipe of said second set of heat pipes terminating adjacent said electronic component.

19. A method of manufacturing a circuit card assembly, said method comprising:
  coupling a heat transfer assembly to a first printed circuit board including at least one electronic component mounted thereon, the heat transfer assembly including a first plate extending adjacent at least a portion of the first printed circuit board and a second plate extending adjacent at least a portion of the first plate in a direction of a thickness of the said first plate;
  forming an accommodation feature in at least one of the first plate and the second plate; and
  coupling a set of heat pipes to the heat transfer assembly such that the set of heat pipes removes heat from the at least one electronic component, at least one heat pipe of the set of heat pipes extending adjacent the accommodation feature.

20. The method in accordance with claim 19, wherein forming an accommodation feature comprises forming a cutout in at least one of the first plate and the second plate.

21. The method in accordance with claim 19, wherein coupling a set of heat pipes to the heat transfer assembly comprises coupling a first set of heat pipes to the first plate and coupling a second set of heat pipes to the second plate.

22. The method in accordance with claim 21 further comprising positioning the first set of heat pipes such that the longitudinal axes of the first set of heat pipes extend in a first direction and positioning the second set of heat pipes such that longitudinal axes of the second set of heat pipes extend in a second direction different from the first direction.

* * * * *